(12) United States Patent
Matsuda (10) Patent No.: US 8,062,085 B2
(45) Date of Patent: Nov. 22, 2011

(54) METHOD OF PRODUCING ORGANIC LIGHT EMITTING DEVICE

(75) Inventor: Koichi Matsuda, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 384 days.

(21) Appl. No.: 12/051,898

(22) Filed: Mar. 20, 2008

(65) Prior Publication Data

US 2008/0233826 A1    Sep. 25, 2008

(30) Foreign Application Priority Data

Mar. 23, 2007  (JP) .................. 2007-077173
Feb. 1, 2008   (JP) .................. 2008-022362

(51) Int. Cl.
*H01J 9/50* (2006.01)

(52) U.S. Cl. ............................................... 445/2

(58) Field of Classification Search .............. 445/2, 22
See application file for complete search history.

(56) References Cited

U.S. PATENT DOCUMENTS

| 6,605,372 | B1* | 8/2003 | Kubota | 428/690 |
|---|---|---|---|---|
| 6,747,728 | B2* | 6/2004 | Nagayama | 349/192 |
| 2002/0142697 | A1* | 10/2002 | Yamagata et al. | 445/24 |
| 2004/0202777 | A1* | 10/2004 | Nishikawa et al. | 427/66 |
| 2005/0023523 | A1* | 2/2005 | Kawaguchi et al. | 257/40 |
| 2005/0215163 | A1* | 9/2005 | Tamura et al. | 445/24 |
| 2006/0178072 | A1* | 8/2006 | Konda | 445/3 |
| 2006/0214575 | A1* | 9/2006 | Kajiyama et al. | 313/506 |

* cited by examiner

*Primary Examiner* — Toan Ton
*Assistant Examiner* — Zachary Snyder
(74) *Attorney, Agent, or Firm* — Fitzpatrick, Cella, Harper & Scinto (57) ABSTRACT

The present invention provides a method of producing an organic light emitting device capable of repairing a short-circuit between electrodes. The method includes: forming an organic light emitting device including a first electrode, an organic light emitting layer, and a second electrode successively on a substrate, and forming a first sealing layer on the second electrode; removing a short-circuited site of the organic light emitting device by irradiating at least the first sealing layer and the second electrode with a laser in the short-circuited site of the organic light emitting device; and forming a second sealing layer in the short-circuited site which has been removed.

1 Claim, 4 Drawing Sheets

METHOD OF PRODUCING ORGANIC LIGHT EMITTING DEVICE

BACKGROUND OF THE INVENTION

1. Field of the Invention

The present invention relates to a method of producing an organic light emitting device (organic electroluminescence device) used for a display, a light source, or an illumination, and more particularly, to a method of repairing a short-circuited site of the organic light emitting device.

2. Description of the Related Art

Recently, in the development of an organic light emitting device (hereinafter, sometimes abbreviated simply as device), an attempt has been made so as to enhance the characteristics of the device. The organic light emitting device is a light-weight self light emitting device, so an apparatus using an organic light emitting device as a display pixel is expected as a next-generation display apparatus. However, for some reasons, when a part of an organic layer between a first electrode and a second electrode is not formed, and the electrodes are short-circuited, pixels (devices) will become non-light emitting devices.

Such a non-light emitting device is formed by a particle (impurity) generated during the formation of a planarization layer, a separating layer, etc., and is also formed by a short-circuited site caused in a plane of the organic layer due to the surface shape of the first electrode.

As a method of repairing a short-circuited site, a laser repair method has been proposed. According to the laser repair method, a short-circuited site in the device is irradiated with a laser to remove an electrode, whereby the short-circuited site is removed, which enables the portions other than the repaired portion to emit light again.

Japanese Patent Application Laid-Open No. 2001-118684 describes a method including, irradiating a second electrode that is a short-circuited site in the case of a device in which a first electrode, an organic layer, and a second electrode are laminated successively on a substrate, thereby removing the short-circuited site of the second electrode, and thereafter, forming a protective layer over the entire surface.

Further, Japanese Patent No. 3817081 describes a method including forming or laminating a fluorine-based or silicon-based resin on a silicon nitride protective layer formed by plasma CVD method as a resin protective layer. In the case where a short-circuit occurs, laser irradiation is performed. However, even if a power is concentrated on a protective layer side due to a focal point displacement or the like, the resin protective layer is unlikely to be damaged so that moisture resistance is kept. Further, the mechanical strength with respect to external collision can also be enhanced by covering the outermost surface with the resin protective layer.

According to the method including forming a protective layer after repairing a short-circuited site as described in Japanese Patent Application Laid-Open No. 2001-118684, sufficient protection performance may not be obtained unless a thick protective layer is formed.

Regarding the repair of a short-circuited site, it is considered to be an efficient repair method to burn out only a conductive member formed in a short-circuited site. However, the following was found by the experiment conducted by the inventor of the present invention. In the case of repairing a short-circuited site by the irradiation with a laser, in order to repair the short-circuited site infallibly, it is insufficient to merely burn out only a conductive member formed in a short-circuited site, and it is necessary to remove the conductive member formed in the short-circuited member. In this case, the conductive member formed in the short-circuited site or constituent materials of other devices scatter onto a second electrode.

More specifically, if the short-circuited site is removed after the second electrode is formed, the particle having scattered when the second electrode is formed, and the constituent material of the device having scattered when the short-circuited site is repaired need to be covered. That is, in order to prevent water permeation, a thicker protective layer is required.

Further, the repair of a short-circuited site as described in Japanese Patent Application Laid-Open No. 2001-118684 is conducted before a protective layer is formed after a second electrode is formed. Therefore, an organic light emitting device is exposed to atmosphere for a long period of time, which may degrade the device before the protective layer is formed.

On the other hand, according to a method including performing the irradiation with a laser after forming a protective layer as described in Japanese Patent No. 3817081, it is difficult for a protective layer made of an inorganic material to deal flexibly with the evaporation of an underlying layer, so the occurrence of cracks and the like cannot be prevented completely. Further, it is difficult to consider that a single resin protective layer has protection performance equal to that of the inorganic protective layer, which may decrease the protection performance after the irradiation with a laser.

SUMMARY OF THE INVENTION

The present invention solves the above-mentioned problems, and its object is to provide a method of producing an organic light emitting device capable of repairing a short-circuit between electrodes.

A method of producing an organic light emitting device of the present invention includes: forming an organic light emitting device including a first electrode, an organic light emitting layer, and a second electrode successively on a substrate, and forming a first sealing layer on the second electrode; removing a short-circuited site of the organic light emitting device by irradiating at least the first sealing layer and the second electrode with a laser in the short-circuited site of the organic light emitting device; and forming a second sealing layer in the short-circuited site which has been removed.

According to the present invention, a short-circuited site is specified with respect to an organic light emitting device in which layers up to a first sealing layer are laminated, at least the first sealing layer and a second electrode of the short-circuited site are removed by the irradiation with a laser, and only a short-circuited site which has been removed is partially covered with a second sealing layer. Therefore, an organic light emitting device with higher sealing performance and less degradation can be produced with minimum sealing layers.

Further, by forming a first sealing layer first, there is almost no influence of scattered material generated in the course of removing a short-circuited site on the protection performance. Further, since the second sealing layer immediately above a short-circuited site which has been removed can cover almost infallibly with a small area, an organic light emitting device having a sealing layer excellent in sealing performance can be provided.

Further features of the present invention will become apparent from the following description of exemplary embodiments with reference to the attached drawings.

DESCRIPTION OF THE EMBODIMENTS

Hereinafter, a method of producing an organic light emitting device of the present invention will be described in detail with reference to the drawings.

According to the present invention, a short-circuited site of an organic light emitting device is repaired by the processes of: (1) specifying a short-circuited site; (2) removing the short-circuited site; and (3) covering the short-circuited site which has been removed. Hereinafter, those processes will be described in detail.

Figure 1:
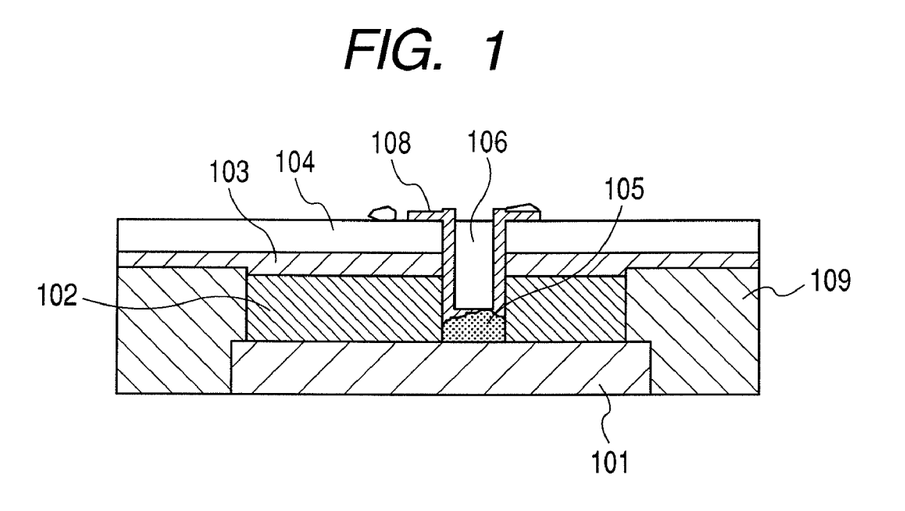
FIG. 1 is a schematic cross-sectional view of an organic light emitting device produced by a method of producing an organic light emitting device according to the present invention.

FIG. 1 shows an organic light emitting device with a short-circuited site repaired. Reference numeral 101 of FIG. 1 denotes a first electrode, 102 denotes an organic layer, 103 denotes a second electrode, 104 denotes a first sealing layer, 105 denotes a particle (impurity), 106 denotes a short-circuited site which has been removed, 108 denotes a second sealing layer, and 109 denotes a device separating layer.

First, an organic light emitting device including the first electrode 101 and the second electrode 103 is formed on a substrate (not shown), and the first sealing layer 104 made of an inorganic material is formed on the second electrode 103. TFT circuits (not shown) are previously placed on the substrate, and the organic light emitting device with the second electrode 103 formed thereon can emit light when a driving apparatus is connected to an outer lead electrode.

In the case of producing an organic light emitting apparatus in which a plurality of organic light emitting devices are arranged, a plurality of organic light emitting apparatuses may be formed collectively with one large substrate, and they may be divided into each organic light emitting apparatus. In this case, the devices can emit light in the large substrate state before division. Each of the light emitting devices (pixels) is connected via the TFT circuits. Therefore, when electrodes are short-circuited, only a pixel including a short-circuited site does not emit light and hence, becomes a so-called defective pixel.

First, specifying a short-circuited site will be described.

Figure 2:
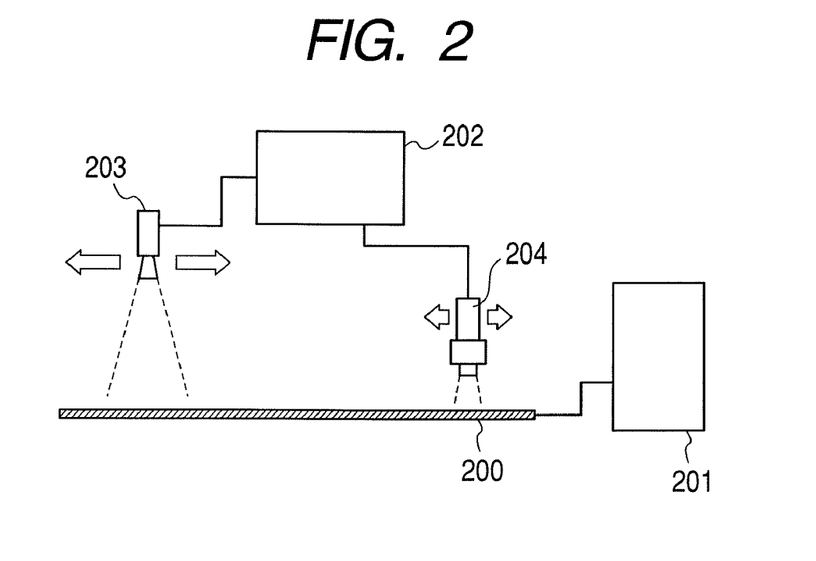
FIG. 2 is a structural view illustrating that a second sealing layer is formed using a laser generation apparatus after specifying and removing a short-circuited site.

FIG. 2 is a structural view illustrating that a short-circuited site is specified, and a second sealing layer is formed on the short-circuited site with a laser generation apparatus. In FIG. 2, reference numeral 200 denotes a substrate including TFT circuits, 201 denotes a driving apparatus for allowing a device to emit light, 202 denotes a control apparatus, 203 denotes a low-magnification microscope, and 204 denotes a high-magnification microscope and a laser generation apparatus capable of irradiating light in the same optical axis. The images of the two microscopes and the positions of the apparatuses including a laser are managed by the control apparatus 202.

First, the organic light emitting device with the first sealing layer 104 formed thereon is connected to the driving apparatus 201, whereby the organic light emitting device is allowed to emit light. Then, all the devices are photographed with the low-magnification microscope 203, whereby the address of a non-light emitting device is identified. Further, the high-magnification microscope 204 is moved to the non-light emitting device, and a short-circuited site is found out from the device that does not emit light.

The short-circuited site is specified by allowing the device to emit light. Therefore, the short-circuited site is specified from a substrate side in the case of a bottom emission type device that emits light from the substrate side, and specified from a side opposite to the substrate in the case of a top emission type device that emits light from a side opposite to the substrate.

The short-circuited site is mostly caused as follows: the organic layer 102 is not formed in a predetermined portion in the layer configuration, whereby the second electrode 103 and the first electrode 101 come into contact with each other. This may be ascribed to the presence of the particle (impurity) 105 on the first electrode 101. Thus, by specifying the position of the particle 105 in the device and irradiate it with a laser to eliminate the short-circuited site, whereby the device emits light.

The position of the particle 105 can be easily identified when the difference in layer level in the device is made clear. For this purpose, it is more desired to allow light to be incident obliquely, compared with a bright field image formed by ordinary epi-illumination.

Next, removing a short-circuited site will be described.

The size of the particle 105 causing a short-circuit can be suppressed to a predetermined size by washing a substrate and correctly performing particle management up to a process before film formation. If the size of the particle 105 is a predetermined size or less, it is easy to set a laser power, and a short-circuited site alone can be removed without giving a large damage to the device.

The short-circuited site can be repaired by removing only the second electrode 103, but actually, it is general that other portions are also removed. Thus, the laser irradiation is started from a small power. Then, the power is gradually increased, and when light is emitted, the irradiation is stopped. This is repeated to each short-circuited site.

The laser irradiation may be performed from the substrate side or the side opposite to the substrate side. In the case of a top emission type device, it is preferred that the laser irradiation be performed from the side opposite to the substrate, i.e., from the first sealing layer side because the optical apparatus used for specifying a short-circuited site can also be used for laser irradiation.

In the present invention, a short-circuited site is removed after the first sealing layer 104 is formed. Therefore, the short-circuited site can be removed in an atmosphere or in an inactive gas atmosphere. In the case of removing the short-circuited site before forming the first sealing layer, the removal of the short-circuited site is required to be performed under vacuum so that moisture, oxygen, or the like do not come into contact with the organic layer. However, it is very difficult that the driving power source for driving a device is connected to a device to allow the device to emit light, and the short-circuited site is removed in vacuum. Regarding this point, the selection of an environment for removing a short-circuited site is wide in the present invention, so the short-circuited site can be removed in a shorter period of time at a low cost.

Next, covering a removed site (short-circuited site which has been removed 106) will be described.

In the short-circuited site which has been removed 106, the first sealing layer 104 as well as the second electrode 103 is removed in most cases. When the organic light emitting device is exposed to the atmosphere for a long period of time without treating the short-circuited site which has been removed 106, moisture, oxygen, or the like enter the organic layer 102 from the atmosphere, and the repaired device may return to a non-light emitting state. Further, dark spots spread from the removed site, and finally, a plurality of devices may not emit light over a wide range. According to the present invention, the short-circuited site which has been removed 106 is covered with the second sealing layer 108. In the case where light emitted from the organic light emitting device is taken out from the first sealing layer side, the second sealing layer 108 is preferably a light-transmitting member with high sealing performance, such as silicon nitride, silicon oxide, or silicon oxynitride. However, a repaired site basically does not emit light, so the second sealing layer 108 may be made of a light-shielding member of metal or the like. Even if the repaired site emits light, the range of the emission is small in one organic light emitting device, so there is almost no influence on the emission amount. Metal has sealing performance higher than those of the other members, so the second sealing layer is preferably made of metal in view of the enhancement of sealing performance.

Examples of the metal include titanium, chromium, molybdenum, and tungsten. For formation of the second sealing layer 108, a method capable of forming a film locally is used. A laser CVD method and a microplasma CVD method using a plasma torch are used preferably.

The gas to be used is metal carbonyl such as $Cr(CO)_6$, $W(CO)_6$, and $Mo(CO)_6$, and is used alone or together with a carrier gas such as argon. A laser is preferably a high-repetition pulse laser. If the high-repetition pulse is used, a laser power is given uniformly by minutely moving a laser irradiation surface in accordance with a surface to be treated. Consequently, a deposited film is formed uniformly.

According to the film formation method, a second sealing layer 108 is deposited by a micro area CVD method of flowing a material gas containing the above-mentioned metal to the substrate surface, and irradiating the short-circuited site which has been removed 106 with a laser. The deposited film thickness is such a size as to satisfy moisture proof performance, and the deposition area is appropriately changed in accordance with the area of the short-circuited site which has been removed 106. The deposition area may be changed by measuring the area before the commencement of film formation by the micro area CVD method, or may depend upon a laser power during removal of a short-circuit.

According to the method of producing an organic light emitting device of the present invention, a short-circuited site is specified with respect to an organic light emitting device with the first sealing layer 104 deposited thereon. Then, at least the first sealing layer 104 and the second electrode 103 in the short-circuited site are removed by irradiation with a laser, whereby only a short-circuited site which has been removed is covered with the second sealing layer 108. Therefore, an organic light emitting device with higher sealing performance and less degradation can be produced with minimum sealing layers.

Further, by forming the first sealing layer 104 first, there is almost no influence of a scattered material (constituent material of the device) generated during the process of removing a short-circuited site on the protection performance. Further, the second sealing layer 108 immediately above the short-circuited site which has been removed can be covered almost infallibly with a small area, so a production method having an excellent sealing layer can be provided.

It is preferred that the present invention have the process of filling the short-circuited site which has been removed 106 with an insulating member (not shown). In the case where the present invention has the process of filling the short-circuited site which has been removed 106 with an insulating member, the process of covering the short-circuited site which has been removed 106 is performed after the above process. The short-circuited site which has been removed 106 may be covered directly with the second sealing layer 108. However, in the case where the short-circuited site which has been removed 106 is deep, for example, in the case where the first sealing layer 104 is thick, the second sealing layer 108 may not be formed uniformly, and the short-circuited site which has been removed 106 cannot be covered sufficiently with the second sealing layer 108. In such a case, the short-circuited site which has been removed 106 is filled with an insulating member so as to be flattened, and thereafter, is covered with the second sealing layer 108, whereby the short-circuited site which has been removed 106 can be covered with the second sealing layer 108 more infallibly, and the organic light emitting device can be further protected from moisture and the like.

Hereinafter, filling a short-circuited site which has been removed 106 with an insulating member will be described.

Figure 3:
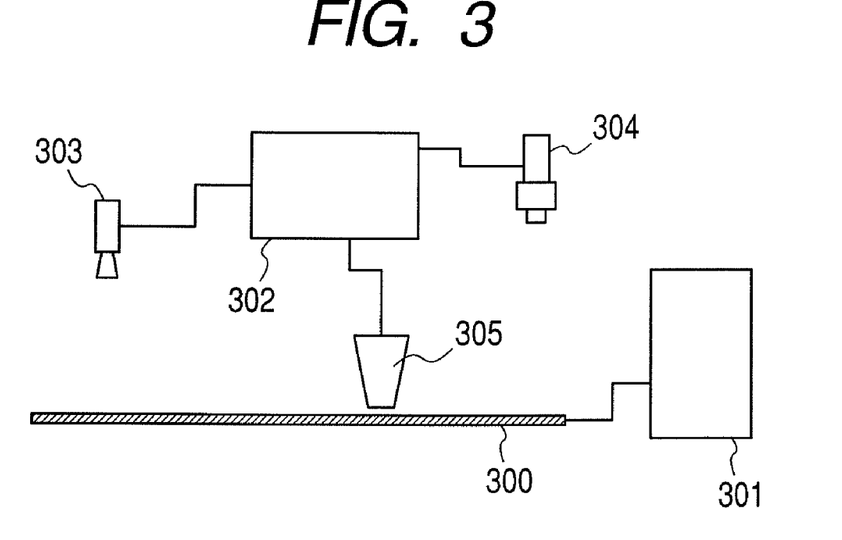
FIG. 3 is a structural view illustrating that a short-circuited site which has been removed is filled with an insulating member using an ink jet apparatus.

FIG. 3 is a structural view illustrating that a short-circuited site which has been removed is filled with an insulating member using an ink jet method. In FIG. 3, reference numeral 300 denotes a substrate with a short-circuited site removed, 301 denotes a driving apparatus for allowing a device to emit light, 302 denotes a control apparatus, 303 denotes a low-magnification microscope, 304 denotes a high-magnification microscope and a laser generation apparatus capable of irradiating in the same optical axis, and 305 denotes an ink jet apparatus.

The ink jet apparatus 305 is placed at the same position as that of laser irradiation, and the discharge amount thereof is adjusted based on the size of the short-circuited site which has been removed 106. Examples of an ink jet system include those using a piezoelectric element and those using air bubbles by heating. A filling material in which a small amount of an insulating member is dissolved in an organic solvent is injected from the tip end of a narrow nozzle onto the short-circuited site which has been removed 106. The injected filling material spreads to the short-circuited site which has been removed 106 to form a smooth surface. At this time, the filling material is heated at a temperature at which an organic light emitting device is not damaged to thereby removing rapidly an organic solvent, and otherwise, heat-drying may be started after the completion of filling. The removal of the organic solvent is not limited to heat-drying, and the organic solvent does not need to be removed completely if the organic solvent does not enlarge a non-light emitting area of the organic light emitting device.

Examples of the organic solvent include a linear or branched aliphatic hydrocarbon, alicylic hydrocarbon, a halogen substitution product of these hydrocarbons, a silicon solution, and silicon oil. Resin particles are mixed in these organic solvents as an insulating member. As the resin particles, those which are solid at room temperature and have satisfactory compatibility with the organic solvents are used. Examples of the resin particles include an olefin polymer, a copolymer, a vinyl chloride copolymer, a vinylidene chloride copolymer, a phenol resin, a polycarbonate resin, a polyester resin, and a silicon resin. Further, a dispersion polymer may be used for the purpose of dispersing these resin particles in the organic solvents.

Further, in the case where the short-circuited site which has been removed 106 is only in the second electrode 103, a solution in which a hole injection material is dissolved in an organic solvent can be used as a filling material.

The ink jet apparatus 305 is filled with those filling materials, and an ink jet head is moved to a laser irradiation portion, whereby the position thereof is determined. Therefore, in the case where laser irradiation for removing a short-circuited site is performed from a first sealing layer side, all the processes of specifying a short-circuited site, removing the short-circuited site, forming a filling material, and forming a second sealing layer can be performed from the first sealing layer side. This case is preferred because the optical apparatus can also be used from the process of specifying a short-circuited site to the process of forming a second sealing layer.

The discharge amount of the filling material is generally proportional to a laser power. However, the detailed correlation between the laser power and the size of the short-circuited site which has been removed 106 is determined after performing laser irradiation several times. The amount of a filling material is determined in accordance with the size of the short-circuited site which has been removed 106 thus determined.

A method of filling a short-circuited site which has been removed using an ink jet method has been described. However, a method of filling a short-circuited site which has been removed of the present invention may be another method. Examples of the methods other than the ink jet method include transcription and vapor deposition with a mask.

Hereinafter, a method of producing an organic light emitting device of the present invention will be described by way of examples. However, the present invention is not limited to the following examples.

Example 1

Production of an Organic Light Emitting Device

Figure 5:
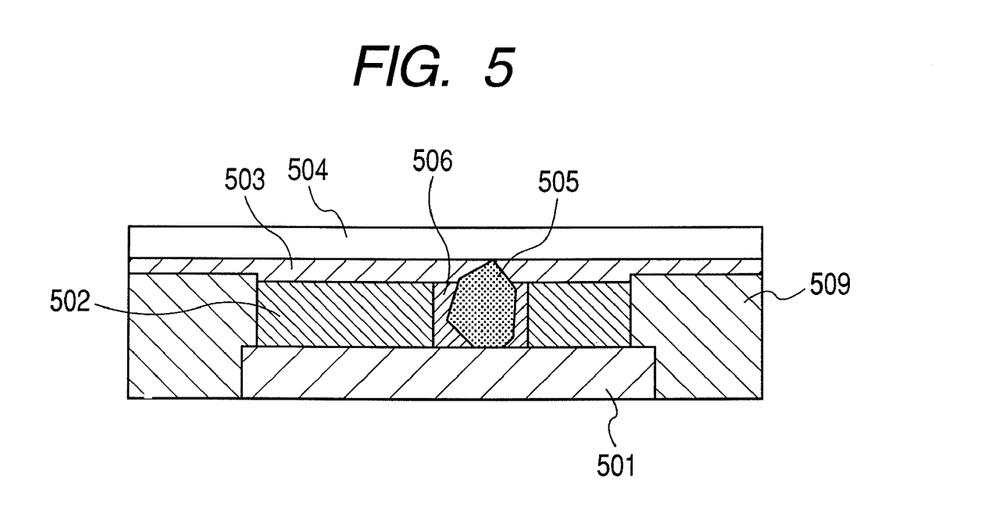
FIG. 5 shows an organic light emitting device before a short-circuited site is repaired.

FIG. 5 schematically shows an organic light emitting device before a short-circuited site is repaired. A plurality of organic light emitting devices shown in FIG. 5 are formed on a substrate, and in this Example, a short-circuited site among a plurality of organic light emitting devices is repaired in the following process. In FIG. 5, 501 denotes a first electrode, 502 denotes an organic layer, 503 denotes a second electrode, 504 denotes a first sealing layer, 505 denotes a particle, 506 denotes a short-circuited site, and 509 denotes a device separating layer.

First, the organic layer 502 was vapor-deposited on an integrated substrate with a size of 400 mm×500 mm with a TFT circuit (not shown) and the first electrode 501 mounted thereon. On the substrate, a plurality of device patterns are placed separately, and are separated after the completion of the production of organic light emitting devices.

In each device pattern, a plurality of first electrodes 501 are partitioned by the device separating layer 509, and the vapor-deposited organic layer 502 is controlled independently by the partitioned first electrodes 501, and hence, is operated as one pixel.

After the organic layer 502 was vapor-deposited, a transparent electrode made of ITO was formed by sputtering as the second electrode 503. Next, the first sealing layer 504 made of silicon nitride was formed on the second electrode 503 with a thickness of 1 µm by a plasma CVD method.

In the case where a foreign material 505 is present on the first electrode 501, the organic layer 502 is not formed on the periphery of the particle 505, and the second electrode 503 enters to form a short-circuited site 506. Further, a plurality of device patterns can be checked for light emission independently, and are connected to the driving apparatus via lead electrodes with respect to the outside of an integrated substrate.

Repair of a Short-Circuited Site

The integrated substrate with the first sealing layer 504 formed thereon was first tested for light emission.

As shown in FIG. 2, alignment correction was performed based on two devices positioned diagonally on a substrate 200 with a size of 400 mm×500 mm. Next, while each device was connected to a driving apparatus 201 so as to be in a light emitting state, all the device patterns were photographed with a low-magnification microscope 203 (objective lens: 5 times). The number of photographs was 80, and it was determined whether light was emitted or not regarding all the pixels in the device patterns. Since alignment correction was performed, the position of non-light emission could be grasped exactly, and was recorded in the control apparatus 202.

Next, a high-magnification microscope 204 (objective lens: 20 times) was moved to a non-light emitting pixel portion, and illuminates the non-light emitting pixel portion with ring-shaped illumination to observe a dark field image in a simulation manner, and the optical axis was adjusted to the particle 505 considered to cause a short-circuit. The size of the short-circuited site 506 was read, and the size of the removal with a laser was determined from an image observed therein.

Further, the short-circuited site 506 was removed with a HOYA Laser System HCL-3100 (not shown) as a laser irradiation apparatus. The irradiation of a YAG laser with a wavelength of 532 nm having the same optical axis as that of the high-magnification microscope 204 (objective lens: 20 times) was started with a pulse width of 6 ns and an output dial value of 10. The irradiated surface was scanned with a beam diameter of 10 µm adjusted to the diameter of the particle 505 observed with the high-magnification microscope 204. After the start of the irradiation, laser irradiation was stopped when a non-lighting pixel was lit, whereby the removal of the short-circuited site 506 was completed.

Further, the short-circuited site which has been removed was filled with a filling material (insulating member) using the ink jet apparatus 305 shown in FIG. 3. The ink jet apparatus 305 is connected to the control apparatus 302, and determines the amount of the filling material and the injection position thereof based on the processing information of the short-circuited site removed by laser irradiation. The tip end width of the ink jet head was set to be 10 µm, and the distance from the head to the short-circuited site which has been removed was set to be 1.0 mm. The projecting pulse width was at least 50 microseconds, and appropriately changed depending upon the size of the short-circuited site which has been removed. As the insulating member, latex with a particle diameter of about 0.1 µm polymerized from vinyl acetate was used.

Figure 6:
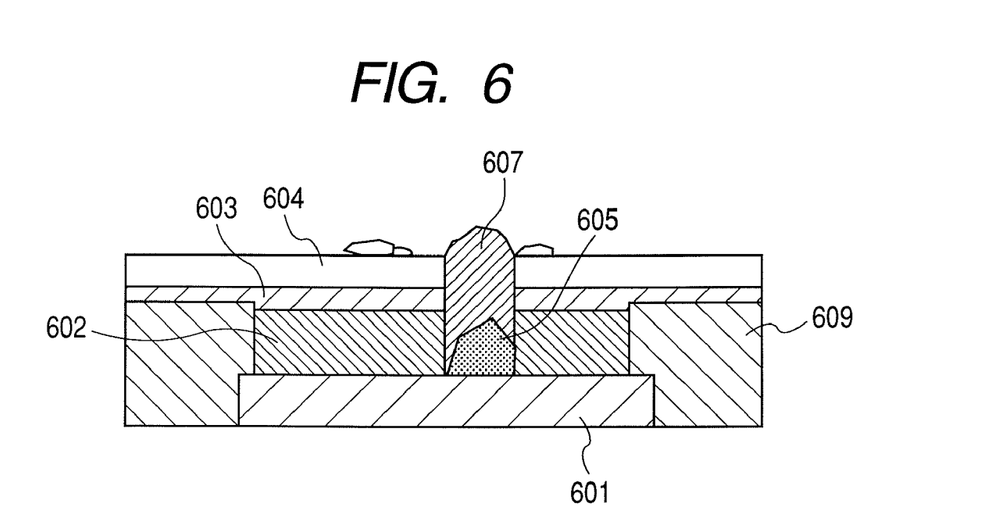
FIG. 6 is a schematic cross-sectional view of an organic light emitting device in which a short-circuited site which has been removed is filled with an insulating member.

FIG. 6 is a schematic cross-sectional view of an organic light emitting device filled with an insulating member as described above. In FIG. 6, 601 denotes a first electrode, 602 denotes an organic layer, 603 denotes a second electrode, 604 denotes a first sealing layer, 605 denotes a particle, 607 denotes an insulating member, and 609 denotes a device separating layer. As shown in FIG. 6, the second electrode 603 on the particle 605 is disappeared, and the removed site is filled with an insulating member 607.

Figure 4:
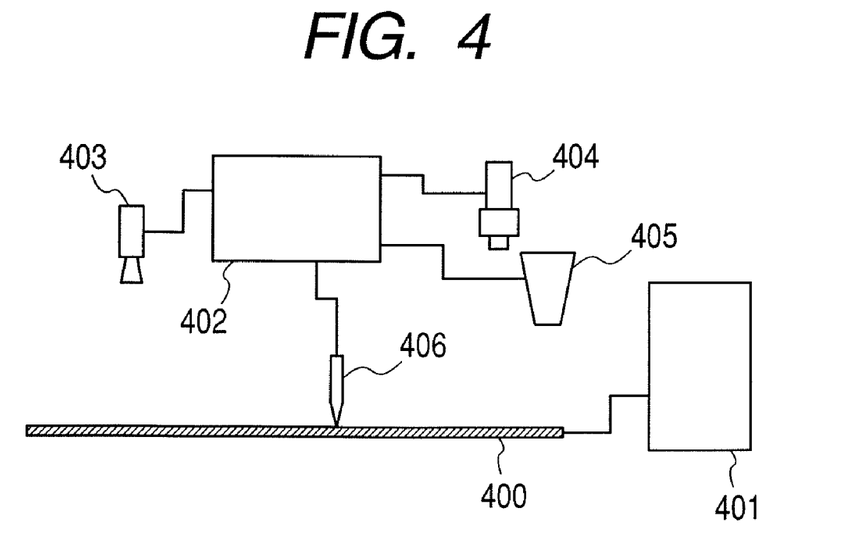
FIG. 4 is a structural view illustrating that a second sealing layer is formed in a short-circuited site which has been removed using a micro area CVD apparatus.

FIG. 4 is a structural view illustrating that a second sealing layer is formed on a short-circuited site which has been removed using a micro area CVD method. In FIG. 4, 400 denotes a substrate with a short-circuited site removed, 401 denotes a driving apparatus for allowing a device to emit light, and 402 denotes a control apparatus. 403 denotes a low-magnification microscope, 404 denotes a high-magnification microscope and a laser generation apparatus capable of irradiating in the same optical axis, 405 denotes an ink jet apparatus, and 406 denotes a micro area CVD apparatus.

The micro area CVD apparatus 406 is connected to the control apparatus 402, and moves the micro area CVD apparatus 406 to a desired place based on the information on the position and size of a short-circuited site which has been removed of the control apparatus 402.

Next, a mixed gas of chromium carbonyl $Cr(CO)_3$ and argon gas was introduced into a chamber by a gas supply unit, and an exhaust apparatus was operated, whereby the internal pressure of the chamber was kept constant. Next, a YAG laser with a wavelength of 266 nm, a pulse width of 70 ns, and a repetition frequency of 10 kHz was radiated with an output dial 20 for 5 seconds, whereby a Cr film with a thickness of 700 nm and a diameter of 15 μm was formed. The laser was scanned based on the size of the short-circuited site which has been removed, and the irradiation time was adjusted so as to be equal per unit area.

Figure 7:
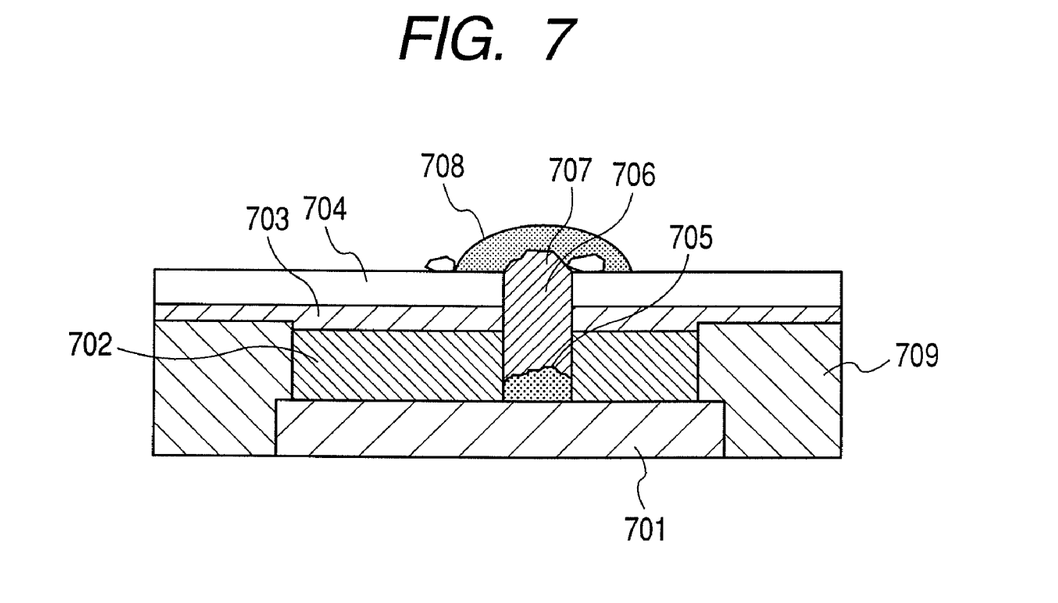
FIG. 7 is a schematic cross-sectional view of an organic light emitting device in which a second sealing layer is formed on an insulating member.

FIG. 7 is a schematic cross-sectional view of the organic light emitting device thus produced. In FIG. 7, 701 denotes a first electrode, 702 denotes an organic layer, 703 denotes a second electrode, 704 denotes a first sealing layer, 705 denotes a particle, 706 denotes a short-circuited site, 707 denotes an insulating member, 708 denotes a second sealing layer, and 709 denotes a device separating layer. The cross-section of the organic light emitting device was observed with a TEM, whereby the covering state of the second sealing layer 708 was checked. Consequently, it was found that the insulating member 707 fills the short-circuited site which has been removed densely, and the second sealing layer 708 of Cr covers the short-circuited site which has been removed without generation of cracks.

Further, the organic light emitting device is connected to the driving power source from each electrode and is allowed to emit light, whereby the light emitting efficiency was measured to obtain an initial light emitting efficiency. After that, in order to check protection performance, the organic light emitting device was kept in a thermostat at a temperature of 60° C. and a humidity of 90% for 500 hours. After the elapse of 500 hours, the light emitting efficiency was measured to obtain a light emitting efficiency after duration. Consequently, it was found that the light emitting efficiency after duration was 95% or more of the initial light emitting efficiency, and function as a sealing layer was sufficient.

Example 2

An organic layer was vapor-deposited, and a second electrode and a first sealing layer were formed thereon successively, using a substrate similar to that produced in Example 1.

Next, each pixel was subjected to alignment correction, and thereafter, a light emission inspection was performed, whereby a short-circuited site was removed with a laser in the same way as in Example 1 except for setting the wavelength of a laser to be 266 nm.

Next, the short-circuited site which has been removed was filled with an insulating member. A hole injection material dissolved in an organic solvent was used as a filling material. At this time, the organic light emitting device with the first sealing layer formed thereon was kept at 60° C., and the organic solvent was evaporated immediately after being injected onto a substrate. The short-circuited site which has been removed was filled with a solution in which 0.5% triphenylamine was dissolved as a hole injection material with an ink jet apparatus.

Subsequently, tungsten was formed as a second sealing layer on the insulating member, using the micro area CVD apparatus shown in FIG. 4, in the same way as in Example 1 except for using a mixed gas of $W(CO)_3$ and argon gas as a material gas.

The cross-section of the organic light emitting device thus produced was observed with a TEM in the same way as in Example 1, whereby the insulating member and the covering state of the second sealing layer were checked. Consequently, it was found that the insulating member fills the short-circuited site which has been removed densely, and the second sealing layer covers the insulating member without generation of cracks.

Further, the initial light emitting efficiency and the light emitting efficiency after duration at a temperature of 60° C. and a humidity of 90% for 500 hours of the organic light emitting device were measured. Consequently, it was found that the light emitting efficiency after duration was 93% or more of the initial light emitting efficiency, and function as the sealing layer was sufficient.

PART LIST

101 first electrode
102 organic layer
103 second electrode
104 first sealing layer
105 particle
106 short-circuited site which has been removed
108 second sealing layer
109 device separating layer
200, 300, 400 substrate
201, 301, 401 driving apparatus
202, 302, 402 control apparatus
203, 303, 403 low-magnification microscope
204, 304, 404 high-magnification microscope and a laser generation apparatus
305, 405 ink jet apparatus
406 micro area CVD apparatus
501, 601, 701 first electrode
502, 602, 702 organic layer
503, 603, 703 second electrode
504, 604, 704 first sealing layer
505, 605, 705 particle
506, 706 short-circuited site
607, 707 insulating member
708 second sealing layer
509, 609, 709 device separating layer While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2007-077173, filed Mar. 23, 2007 and 2008-022362, filed Feb. 1, 2008, which are hereby incorporated by reference herein in their entirety.

What is claimed is:

1. A method of producing an organic light emitting device, comprising, in sequence, steps (a)-(d):
    (a) forming an organic light emitting device including a first electrode, an organic light emitting layer, and a second electrode successively on a substrate, and forming a first sealing layer on the second electrode;
    (b) removing the first sealing layer and the second electrode by irradiating the first sealing layer and the second electrode with laser whereby a short-circuited site of the organic light emitting device is created;
    (c) filling the short-circuited site with an insulating member so as to be flattened; and
    (d) forming a metal layer as a second sealing layer on the insulating member.

* * * * *